United States Patent
Ramesh

(10) Patent No.: US 12,079,589 B2
(45) Date of Patent: Sep. 3, 2024

(54) MEMORY ARRAY DATA STRUCTURE FOR POSIT OPERATIONS

(71) Applicant: Micron Technology, Inc., Boise, ID (US)

(72) Inventor: Vijay S. Ramesh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 17/859,849

(22) Filed: Jul. 7, 2022

(65) Prior Publication Data

US 2022/0357918 A1 Nov. 10, 2022

Related U.S. Application Data

(62) Division of application No. 16/358,971, filed on Mar. 20, 2019, now Pat. No. 11,403,067.

(51) Int. Cl.
*G06F 3/06* (2006.01)
*G06F 7/483* (2006.01)
(Continued)

(52) U.S. Cl.
CPC ............ *G06F 7/483* (2013.01); *G06F 3/0638* (2013.01); *G06F 7/57* (2013.01); *G11C 11/409* (2013.01); *H03M 7/24* (2013.01); *G06F 3/0655* (2013.01)

(58) Field of Classification Search
CPC .......... G06F 7/483; G06F 3/0638; G06F 7/57; G06F 3/0655; G11C 11/409; G11C 8/16;
(Continued)

(56) References Cited

U.S. PATENT DOCUMENTS

| | | |
|---|---|---|
| 4,758,972 A | 7/1988 | Frazier |
| 5,694,143 A | 12/1997 | Fielder et al. |

(Continued)

FOREIGN PATENT DOCUMENTS

| | | |
|---|---|---|
| CN | 105027212 | 11/2015 |
| CN | 108649946 | 10/2018 |

OTHER PUBLICATIONS

Zachariah Carmichael, "Deep Positron: A Deep Neural Network Using the Posit No. System", Jan. 19, 2019, Cornell University, (Year: 2019).*

(Continued)

*Primary Examiner* — Nanci N Wong
(74) *Attorney, Agent, or Firm* — Brooks, Cameron & Huebsch, PLLC

(57) ABSTRACT

Systems, apparatuses, and methods related to a memory array data structure for posit operations are described. Universal number (unum) bit strings, such as posit bit string operands and posit bit strings representing results of arithmetic and/or logical operations performed using the posit bit string operands may be stored in a memory array. Circuitry deployed in a memory device may access the memory array to retrieve the unum bit string operands and/or the results of the arithmetic and/or logical operations performed using the unum bit string operands from the memory array. For instance, an arithmetic operation and/or a logical operation may be performed using a first unum bit string stored in the memory array and a second unum bit string stored in the memory array. The result of the arithmetic operation and/or the logical operation may be stored in the memory array and subsequently retrieved.

20 Claims, 8 Drawing Sheets

(51) Int. Cl.
  *G06F 7/57* (2006.01)
  *G11C 11/409* (2006.01)
  *H03M 7/24* (2006.01)

(58) Field of Classification Search
  CPC ... G11C 11/405; G11C 11/4076; G11C 11/54; G11C 7/1006; G11C 7/1051; G11C 7/1078; H03M 7/24; H03M 9/00; G06N 3/063
  See application file for complete search history.

(56) References Cited

U.S. PATENT DOCUMENTS

| | | | | |
|---|---|---|---|---|
| 6,131,157 | A * | 10/2000 | Wang | G06F 9/3853 712/217 |
| 7,865,541 | B1 | 1/2011 | Langhammer | |
| 8,214,417 | B2 | 7/2012 | Ahmed | |
| 2002/0143720 | A1 | 10/2002 | Anderson et al. | |
| 2011/0219150 | A1* | 9/2011 | Piccirillo | G06F 21/85 710/24 |
| 2014/0250279 | A1 | 9/2014 | Manning | |
| 2015/0339064 | A1* | 11/2015 | Feng | G06F 12/0806 711/103 |
| 2015/0378696 | A1* | 12/2015 | Boehm | G06F 8/445 717/149 |
| 2018/0240510 | A1 | 8/2018 | Hush et al. | |
| 2019/0065110 | A1 | 2/2019 | Lea et al. | |
| 2019/0196740 | A1* | 6/2019 | Notani | G11C 29/022 |
| 2019/0265949 | A1 | 8/2019 | Ito | |
| 2020/0034686 | A1 | 1/2020 | Chiu et al. | |
| 2020/0143232 | A1 | 5/2020 | Ito | |
| 2020/0167632 | A1 | 5/2020 | Kim | |
| 2021/0240945 | A1 | 8/2021 | Strachan et al. | |

OTHER PUBLICATIONS

Klower et al., "Posits as an alternative to floats for weather and climate models", Mar. 13-14, 2019, CoNGA'19, Singapore (Year: 2019).*
Chowdhury et al., NPL-"MB-CNN: Memristive Binary Convolutional Neural Networks for Embedded Mobile Devices" (Year: 2018).*
Gustafson, et al., "Beating Floating Point as its Own Game: Posit Arithmetic", Research Paper, retrieved from <http://www.johngustafson.net/pdfs/BeatingFloatingPoint.pdf>, Jan. 2017, 16 pages.
V. Sze, Y. Chen, T. Yang and J. S. Erner, "Efficient Processing of Deep Neural Networks: A Tutorial and Survey," in Proceedings of the IEEE, vol. 105, No. 12, pp. 2295-2329, Dec. 2017, doi: 10.1109/JPROC.2017.2761740. (Year: 2017).
M. K. Jaiswal and H. K.-. So, "Universal number posit arithmetic generator on FPGA," 2018 Design, Automation & Test in Europe Conference & Exhibition (DATE), Dresden, 2018, pp. 1159-1162, doi: 10.23919/DATE.2018.8342187. (Year: 2018).
Chowdhury et al., "MB-CNN: Memristive Binary Convolutional Neural Networks for Embedded Mobile Devices", J. Low Power Electron. Appl. 2018, 8(4), 38; https://doi.org/10.3390/jlpea8040038 (Year: 2018).
Burr, "Digital Neural Network Implmentations", 1995. Retrieved from the Internet <https://citeseerx.ist.psu.edu/viewdoc/download?doi=10.1.1.53.1931 &rep=rep1 &type=pdf> (Year: 1995).
Patterson et al., "Computer Organization and Design: The Hardware/Software Interface", Fifth Edition, 2014. (Year: 2014).

* cited by examiner

850 ⇢

```
┌─────────────────────────────────────────────────┐
│     PERFORMING AN ARITHMETIC OPERATION OR       │
│  A LOGICAL OPERATION, OR BOTH, USING A FIRST    │
│  UNIVERSAL NUMBER BIT STRING STORED IN A        │── 852
│  MEMORY ARRAY AND A SECOND UNIVERSAL NUMBER     │
│  (UNUM) BIT STRING STORED IN THE MEMORY ARRAY   │
└─────────────────────────────────────────────────┘
```

```
┌─────────────────────────────────────────────────┐
│ DETERMINING, USING CIRCUITRY COUPLED TO A       │
│ MEMORY ARRAY, AN ADDRESS LOCATION IN THE        │
│ MEMORY ARRAY IN WHICH A POSIT BIT STRING        │── 962
│ CORRESPONDING TO A RESULT OF AN ARITHMETIC      │
│ OPERATION OR A LOGICAL OPERATION, OR BOTH       │
│ IS STORED                                       │
└─────────────────────────────────────────────────┘
                         │
┌─────────────────────────────────────────────────┐
│ GENERATING, USING THE CIRCUITRY,                │
│ A COMMAND TO RETRIEVE THE POSIT BIT STRING      │── 964
│ CORRESPONDING TO THE RESULT OF THE ARITHMETIC   │
│ OPERATION OR THE LOGICAL OPERATION, OR BOTH     │
└─────────────────────────────────────────────────┘
                         │
┌─────────────────────────────────────────────────┐
│ CAUSING THE RESULT OF THE ARITHMETIC OPERATION  │
│ OR THE LOGICAL OPERATION, OR BOTH TO BE         │── 966
│ TRANSFERRED TO CIRCUITRY EXTERNAL TO THE        │
│ MEMORY ARRAY                                    │
└─────────────────────────────────────────────────┘
```

MEMORY ARRAY DATA STRUCTURE FOR POSIT OPERATIONS

PRIORITY INFORMATION

This application is a Divisional of U.S. application Ser. No. 16/358,971, filed Mar. 20, 2019, the contents of which are included herein by reference.

TECHNICAL FIELD

The present disclosure relates generally to semiconductor memory and methods, and more particularly, to apparatuses, systems, and methods for memory array data structure posit operations.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

BRIEF DESCRIPTION OF THE DRAWINGS

FIG. 8 is a flow diagram representing an example method for arithmetic logic circuitry in accordance with a number of embodiments of the present disclosure.

FIG. 9 is another flow diagram representing an example method for arithmetic logic circuitry in accordance with a number of embodiments of the present disclosure.

DETAILED DESCRIPTION

Figure 1A:
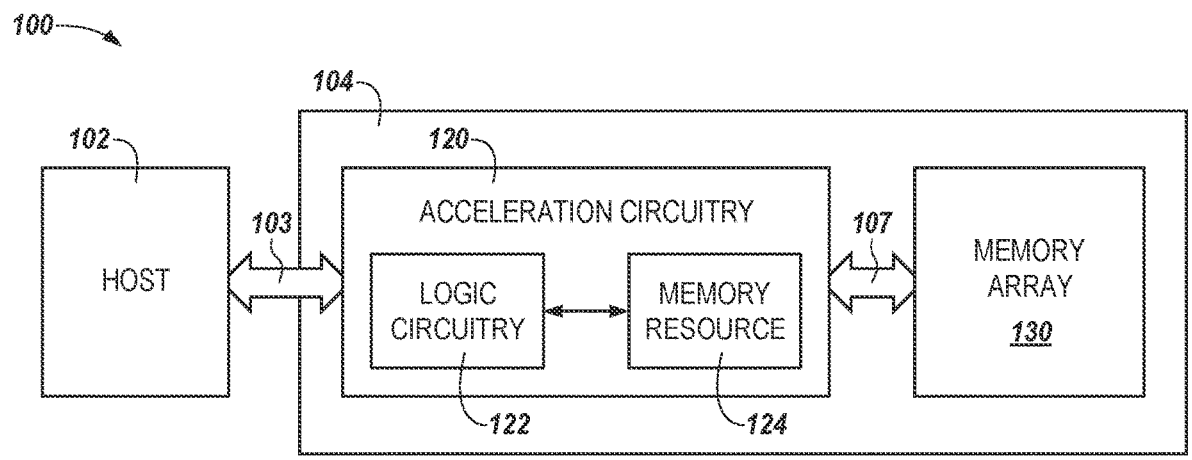
FIG. 1A is a functional block diagram in the form of a computing system including an apparatus including a host and a memory device in accordance with a number of embodiments of the present disclosure.

Systems, apparatuses, and methods related to a memory array data structure for posit operations are described. Universal number (unum) bit strings, such as posit bit string operands and posit bit strings representing results of arithmetic and/or logical operations performed using the posit bit string operands may be stored in a memory array. Circuitry deployed in a memory device may access the memory array to retrieve the unum bit string operands and/or the results of the arithmetic and/or logical operations performed using the unum bit string operands from the memory array. For instance, an arithmetic operation and/or a logical operation may be performed using a first unum bit string stored in the memory array and a second unum bit string stored in the memory array. The result of the arithmetic operation and/or the logical operation may be stored in the memory array and subsequently retrieved.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, in some approaches operands are stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the fraction to indicate whether a real number is an exact float, or if it lies in the interval between adjacent floats. The sign, exponent, and fraction bits in a Type I unum take their definition from the IEEE 754 floating-point format, however, the length of the exponent and fraction fields of Type I unums can vary dramatically, from a single bit to a maximum user-definable length. By taking the sign, exponent, and fraction bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, which permits a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. For example, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for a broader dynamic range and a higher accuracy (e.g., precision) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications, in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits (e.g., a smaller bit width) than floats or other numerical formats. By using fewer bits to achieve a same or enhanced outcome in comparison to floats or other numerical formats, the use of posits can therefore reduce an amount of time in performing operations and/or reduce the amount of memory space required in applications, which can improve the overall function of a computing system in which posits are employed.

Embodiments herein are directed to generating and/or storing bit strings (e.g., posit bit strings) in a data structure in a memory array. The bit strings can include posit bit string operands and/or resultant posit bit strings that represent a result of an operation (e.g., an arithmetic and/or logical operation) performed between the posit bit string operands. In some embodiments, a state machine can be included in a memory device to facilitate storing and/or retrieval of the bit strings in or from the memory array. The state machine can be configured to generate certain commands that can include a command to retrieve the bit strings from the memory array and/or cause the bit strings to be transferred out of the array to circuitry external to the memory array. By retrieving the bit strings from the memory array using a state machine, performance of a computing device such as the memory device and/or a host coupled to the memory device may be improved in comparison to some approaches. For example, the state machine may require minimal circuitry to perform tasks and operations to store and/or retrieve the bit strings from the memory array, which can reduce an amount of circuitry utilized in some approaches. Further, in embodiments described herein, an amount of processing resources and/or an amount of time consumed in performing operations using the stored bit strings can be reduced in comparison to some approaches because a result of an operation using the bit strings can be stored and retrieved as opposed to approaches in which a calculation is performed using bit string operands each time performance of an operation using the bit strings is invoked.

In some embodiments, hardware circuitry (e.g., logic circuitry) configured to perform various operations on bit strings may be utilized to improve the overall functioning of a computing device. For example, embodiments herein are directed to hardware circuitry that is configured to perform conversion operations to convert a format of a bit string from a first format (e.g., a floating-point format) to a second format (e.g., a universal number format such as a posit format). Once the bit string(s) have been converted to the second format, the circuitry can be operated to perform operations (e.g., arithmetic operations, logical operations, etc.) on the converted bit strings.

In some embodiments, the circuitry can be further operated to convert the results of the operations back to the first format (e.g., to a floating-point format), which can, in turn, be transferred to different circuitry (e.g., a host, another component in a memory device, etc.) of the computing system. By performing the operations in such a manner, the logic circuitry can facilitate improved performance of the computing system by allowing for improved accuracy in the performed operations, improved speed in performing the operations, and/or a reduced required storage space for bit strings during performance of arithmetic and/or logical operations.

Subsequent to performance of the operations, the bit strings used as operands in the operations and/or a resultant bit string that represents a result of the operation performed between the bit string operands may be stored in a memory array. The bit string operands and/or the resultant bit string may be retrieved in response to commands generated by the state machine and the bit strings and/or the resultant bit string may be transferred to a location external to the memory array as part of performance of additional operations and/or for use in one or more applications that may be executed during operation of a computing device in which the memory array is utilized.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "Y," "N," "J," "R," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things. Furthermore, the words "can" and "may" are used throughout this application in a permissive sense (i.e., having the potential to, being able to), not in a mandatory sense (i.e., must).

The term "include," and derivations thereof, means "including, but not limited to." The terms "coupled" and "coupling" mean to be directly or indirectly connected physically or for access to and movement (transmission) of commands and/or data, as appropriate to the context. The terms "bit string," "data," and "data values" are used interchangeably herein and can have the same meaning, as appropriate to the context. The term "resident on" refers to a condition in which one or more components are physically disposed on one or more different components. Furthermore, the terms "data," "plurality of bits" and "bit string" may be used interchangeably herein, and the term "number" can, depending on the context, refer to a bit string or plurality of bits.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 433-1, 433-2, . . . , 433-N may be referred to generally as 433. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory device 104 can include a one or more memory modules (e.g., single in-line memory modules, dual in-line memory modules, etc.). The memory device 104 can include volatile memory and/or non-volatile memory. In a number of embodiments, memory device 104 can include a multi-chip device. A multi-chip device can include a number of different memory types and/or memory modules. For example, a memory system can include non-volatile or volatile memory on any type of a module. In addition, each of the components (e.g., the host 102, the acceleration circuitry 120, the logic circuitry 122, the memory resource 124, and/or the memory array 130) can be separately referred to herein as an "apparatus." Although not explicitly shown in FIG. 1A, the memory device 104 can be coupled to one or more media devices, such as solid-state drive(s), flash media devices, etc.

The memory device 104 can provide main memory for the computing system 100 or could be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device. For instance, the memory device 104 can include RAM, ROM, DRAM, SDRAM, PCRAM, RRAM, and flash memory, among others. Non-limiting examples of memory arrays are described in further detail in connection with FIGS. 7A-7C, herein.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof.

As illustrated in FIG. 1A, a host 102 can be coupled to the memory device 104. In a number of embodiments, the memory device 104 can be coupled to the host 102 via one or more channels (e.g., channel 103). In FIG. 1A, the memory device 104 is coupled to the host 102 via channel 103 and acceleration circuitry 120 of the memory device 104 is coupled to the memory array 130 via a channel 107. The host 102 can be a host system such as a personal laptop computer, a desktop computer, a digital camera, a smart phone, a memory card reader, and/or internet-of-thing enabled device, among various other types of hosts, and can include a memory access device, e.g., a processor. One of ordinary skill in the art will appreciate that "a processor" can intend one or more processors, such as a parallel processing system, a number of coprocessors, etc.

The host 102 can include a system motherboard and/or backplane and can include a number of processing resources (e.g., one or more processors, microprocessors, or some other type of controlling circuitry). The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

Figure 2:
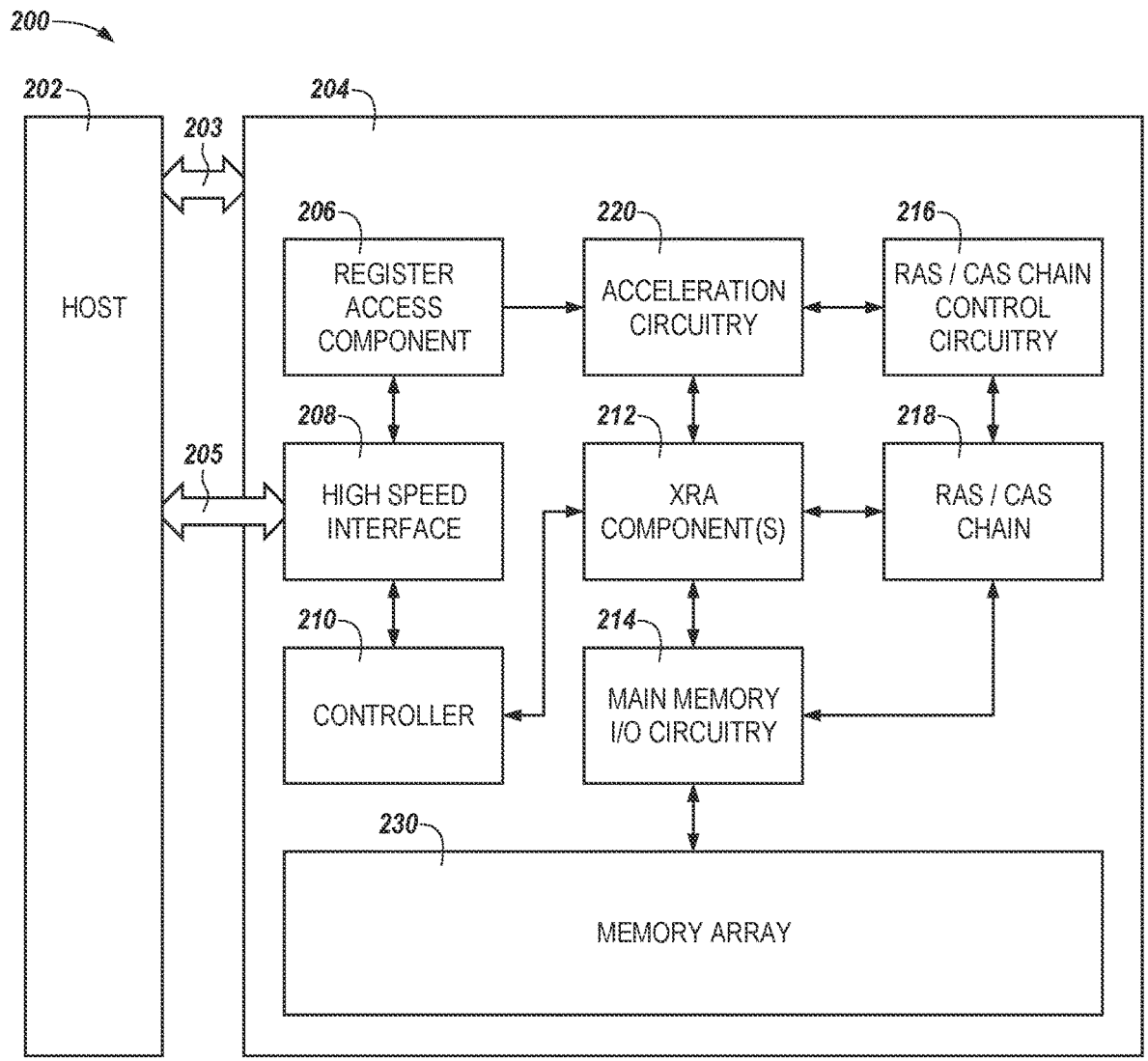
FIG. 2 is another functional block diagram in the form of a computing system including an apparatus including a host and a memory device in accordance with a number of embodiments of the present disclosure.

The memory device 104, which is shown in more detail in FIG. 2, herein, can include acceleration circuitry 120, which can include logic circuitry 122 and a memory resource 124. The logic circuitry 122 can be provided in the form of an integrated circuit, such as an application-specific integrated circuit (ASIC), field programmable gate array (FPGA), system-on-a-chip, or other combination of hardware and/or circuitry that is configured to perform operations described in more detail, herein. For example, the logic circuitry 122 can be configured to receive one or more bit strings in a first format (e.g., a plurality of bits in a floating-point format), convert the one or more bit strings to a second format (e.g., encode the plurality of bits in a posit format), and/or cause performance of operations such as arithmetic and/or logical operations using the one or more bit strings having the second format. As used herein, the bit string(s) in the second format (e.g., the bit string(s) in the posit format) include at least one bit referred to as a "sign," a set of bits referred to as a "regime," a set of bits referred to as an "exponent," and a set of bits referred to as a "mantissa" (or significand). Examples of the sign, regime, exponent, and mantissa sets of bits are described in more detail in connection with FIGS. 3 and 4A-4B, herein.

The operations can include conversion operations to convert floating-point bit strings (e.g., floating-point numbers) to bit strings in a posit format, and vice versa. Once the floating-point bit strings are converted to bit strings in the posit format, the logic circuitry 122 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the logic circuitry 122 may be configured to perform (or cause performance of) other arithmetic and/or logical operations.

The logic circuitry 122 can include an arithmetic logic unit (ALU). The ALU can include circuitry (e.g., hardware, logic, one or more processing devices, etc.) to perform operations (e.g., arithmetic operations, logical operations, bitwise operations, etc.) such as the operations described above, on integer binary bit strings, such as bit strings in the posit format. Embodiments are not limited to an ALU, however, and in some embodiments, the logic circuitry 122 can include a state machine and/or an instruction set architecture (or combinations thereof) in addition to, or in lieu of the ALU, as described in more detail in connection with FIG. 5, herein.

The acceleration circuitry 120 can further include a memory resource 124, which can be communicatively coupled to the logic circuitry 122. The memory resource 124 can include volatile memory resource, non-volatile memory resources, or a combination of volatile and non-volatile memory resources. In some embodiments, the memory resource can be a random-access memory (RAM) such as static random-access memory (SRAM). Embodiments are not so limited, however, and the memory resource can be a cache, one or more registers, NVRAM, ReRAM, FeRAM, MRAM, PCM), "emerging" memory devices such as 3-D Crosspoint (3D XP) memory devices, etc., or combinations thereof.

The acceleration circuitry 120 can be communicatively coupled to the memory array 130 via one or more channels 107. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1A, embodiments are not so limited. For instance, memory device 104 a number of memory arrays 130 (e.g., a number of banks of DRAM cells, NAND flash cells, etc.).

The embodiment of FIG. 1A can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

Figure 1B:
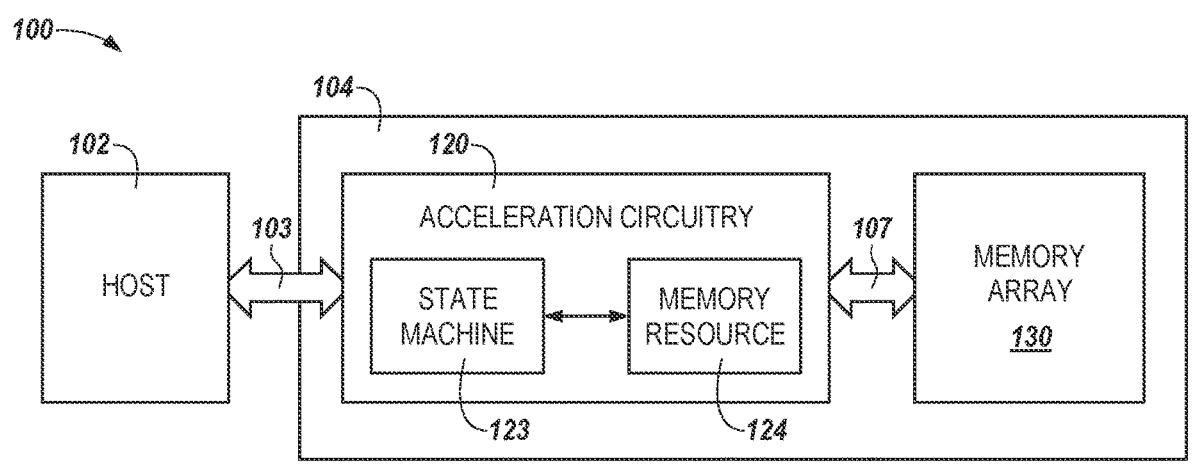
FIG. 1B is another functional block diagram in the form of a computing system including an apparatus including a host and a memory device in accordance with a number of embodiments of the present disclosure.

FIG. 1B is another functional block diagram in the form of a computing system including an apparatus 100 including a host 102 and a memory device 104 in accordance with a number of embodiments of the present disclosure. As shown in FIG. 1B, the apparatus 100 can include a host 102, which can be communicatively coupled to a memory device 104 via a communication path 103. The memory device 104 can include acceleration circuitry 120, which can include a state machine 122 and, optionally, a memory resource 124. The acceleration circuitry 120 can be communicatively coupled to a memory array 130 via a communication path 107. Each of the components (e.g., the host 102, the acceleration circuitry 120, the state machine 122, the memory resource 124, and/or the memory array 130) can be separately referred to herein as an "apparatus."

In the embodiment shown in FIG. 1B where the logic circuitry 122 comprises a state machine 123, the state machine 123 can be configured to execute a specified set of instructions to, for example, write, read, copy, and/or erase bit strings (e.g., data) stored in the memory array 130. For example, as described in more detail, herein, the state machine 123 can execute instructions to read data from one or more rows and/or columns of the memory array 130 to retrieve data stored in the memory array 130. As described in more detail in connection with FIGS. 2 and 6, inter alia, the data can include one or more posit bit string operands and/or one or more results of operations (e.g., arithmetic and/or logical operations). performed between the posit bit string operands and stored in the memory array 130.

By utilizing a state machine 123 configured to execute a specified set of instructions to write and/or retrieve posit bit strings from the memory array 130, improved memory device 104 performance may be realized in comparison to some approaches since an amount of time consuming and/or computing resource intensive processes to perform operations between posit bit strings stored in the memory array 130 may be reduced by storing the result(s) of such operations in the memory array 130 and retrieving the result(s) of the operations directly from the memory array 130.

In some embodiments, the state machine 123 can determine an address in the memory array 130 in which a relevant posit bit string is stored. For example, the state machine 123 can determine a row and/or column address in the memory array 130 in which one or more posit bit string operands are stored and/or a row and/or column address in which a resultant posit bit string that represents performance of an arithmetic and/or logical operation between the one or more posit bit string operands are stored. The state machine 123 can then send a command or request to retrieve the posit bit string(s) that are stored at the addresses in the memory array 130 and/or cause the retrieved posit bit string(s) to be transferred to the host 102, a media device (e.g., a solid-state drive, flash memory device, etc.) coupled to the memory device 102, or to other circuitry external to the memory array 130.

FIG. 2 is another functional block diagram in the form of a computing system including an apparatus 200 including a host 202 and a memory device 204 in accordance with a number of embodiments of the present disclosure. The acceleration circuitry 220 can be analogous to the acceleration circuitry 120 illustrated in FIGS. 1A and 1B. Similarly, the host 202 can be analogous to the host 102 illustrated in FIGS. 1A and 1B, the memory device 204 can be analogous to the memory device 104 illustrated in FIGS. 1A and 1B, and the memory array 230 can be analogous to the memory array 130 illustrated in FIGS. 1A and 1B. Each of the components (e.g., the host 202, the acceleration circuitry 220, the logic circuitry 222, the memory resource 224, and/or the memory array 230, etc.) can be separately referred to herein as an "apparatus."

The host 202 can be communicatively coupled to the memory device 204 via one or more channels 203, 205. The channels 203, 205 can be interfaces or other physical connections that allow for bit strings, data, and/or commands to be transferred between the host 202 and the memory device 205. For example, commands to cause initiation of an operation (e.g., an operation to convert bit strings in a floating-point format to bit strings in a posit format, as well as subsequent arithmetic and/or logical operations on the bit strings in the posit format) to be performed by the acceleration circuitry 220 can be transferred from the host via the channels 203, 205. It is noted that, in some examples, the acceleration circuitry 220 can perform the operations in response to an initiation command transferred from the host 202 via one or more of the channels 203, 205 in the absence of an intervening command from the host 202. That is, once the acceleration circuitry 220 has received the command to initiate performance of an operation from the host 202, the operations can be performed by the acceleration circuitry 220 in the absence of additional commands from the host 202.

In some embodiments, bit strings (e.g., posit bit strings) can be generated and/or stored in the memory array 230 without encumbering the host 202. For example, the bit strings can be generated and/or stored in the memory array 230 without receiving multiple commands from the host 202. Stated alternatively, in some embodiments, the host 202 can send a single command to the memory device to request performance of an operation using one or more bit strings. Responsive to receipt of the command to request performance of the operation, the memory device 204 (e.g., the controller 210, the acceleration circuitry 220, or other components of the memory device 204) can perform the operation and/or retrieve a stored result of the operation in the absence of additional commands from the host 202. This can reduce traffic across the channels 203/205, which can increase performance of a computing device associated with the host 202 and/or the memory device 204.

As shown in FIG. 2, the memory device 204 can include a register access component 206, a high speed interface (HSI) 208, a controller 210, one or more extended row address (XRA) component(s) 212, main memory input/output (I/O) circuitry 214, row address strobe (RAS)/column address strobe (CAS) chain control circuitry 216, a RAS/CAS chain component 218, acceleration circuitry 220, and a memory array 230. The acceleration circuitry 220 is, as shown in FIG. 2, located in an area of the memory device 204 that is physically distinct from the memory array 230. That is, in some embodiments, the acceleration circuitry 220 is located in a periphery location of the memory array 230.

The register access component 206 can facilitate transferring and fetching of bit strings from the host 202 to the memory device 204 and from the memory device 204 to the host 202. For example, the register access component 206 can store addresses (or facilitate lookup of addresses), such as memory addresses, that correspond to bit strings that are to be transferred to the host 202 form the memory device 204 or transferred from the host 202 to the memory device 204. In some embodiments, the register access component 206 can facilitate transferring and fetching bit strings that are to be operated upon by the acceleration circuitry 220 and/or the register access component 206 can facilitate transferring and fetching bit strings that have been operated upon by the acceleration circuitry 220 for transfer to the host 202.

The HSI 208 can provide an interface between the host 202 and the memory device 204 for bit strings, commands, and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)) interface, or other suitable interface for transferring bit strings, commands, and/or data between the host 202 and the memory device 204.

The controller 210 can be responsible for executing instructions from the host 202 and accessing the acceleration circuitry 220 and/or the memory array 230. The controller 210 can be a state machine, a sequencer, or some other type of controller. The controller 210 can receive commands from the host 202 (via the HSI 208, for example) and, based on the received commands, control operation of the acceleration circuitry 220 and/or the memory array 230. In some embodiments, the controller 210 can receive a command from the host 202 to cause performance of an operation using the acceleration circuitry 220. Responsive to receipt of such a command, the controller 210 can instruct the acceleration circuitry 220 to begin performance of the operation(s).

In a non-limiting example, the controller 210 can instruct the acceleration circuitry 220 to perform an operation to retrieve one or more bit strings stored in the memory array 230 and/or a resultant bit string stored in the memory array 230 that represents a result of an operation performed between the one or more bit strings. For example, the controller can receive a command from the host 204 requesting performance of an operation between one or more bit strings and send a command to the acceleration circuitry 220 to perform the operation. The acceleration circuitry 220 (e.g., a state machine resident on the acceleration circuitry 220 such as the state machine 123 illustrated in FIG. 1B, herein) can determine if a result of the requested operation is stored in the memory array 230, determine an address in the memory array 230 at which the result of the requested operation is stored, and/or retrieve the result of the requested operation from the memory array 230. The acceleration circuitry 220 and/or the controller 210 can then cause the result of the requested operation to be transferred to the host 202 or to other circuitry external to the memory array 230.

In some embodiments, the controller 210 can be a global processing controller and may provide power management functions to the memory device 204. Power management functions can include control over power consumed by the memory device 204 and/or the memory array 230. For example, the controller 210 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 210 controlling power consumption of the memory device 204 can include controlling power to various cores of the memory device, for example, to the acceleration circuitry 220, etc.

The XRA component(s) 212 are intended to provide additional functionalities (e.g., peripheral amplifiers) that sense (e.g., read, store, cache) data values of memory cells in an array and that are distinct from the memory array 230. The XRA components 212 can include latches and/or registers. For example, additional latches can be included in an "XRA component 212." The latches of the XRA component 212 can be located on a periphery of the memory array 230 (e.g., on a periphery of one or more banks of memory cells) of the memory device 204.

The main memory input/output (I/O) circuitry 214 can facilitate transfer of bit strings, data, and/or commands to and from the memory array 230. For example, the main memory I/O circuitry 214 can facilitate transfer of bit strings, data, and/or commands from the host 202 and/or the acceleration circuitry 220 to and from the memory array 230. In some embodiments, the main memory I/O circuitry 214 can include one or more direct memory access (DMA) components that can transfer bit strings, blocks of data, etc. from the acceleration circuitry 220 to the memory array 230, and vice versa.

In some embodiments, the main memory I/O circuitry 214 can facilitate transfer of one or more bit strings from the memory array 230 to the acceleration circuitry 220 so that the acceleration circuitry 220 can perform operations on the bit string(s). Similarly, the main memory I/O circuitry 214 can facilitate transfer of bit strings that have had one or more operations performed on it by the acceleration circuitry 220 to the memory array 230. As described in more detail herein, the operations can include operations to convert bit strings formatted according to the floating-point standard to bit strings formatted as a posit (and vice versa), arithmetic operations performed on the bit strings formatted as a posit, logical operations performed on the bit strings formatted as a posit, etc.

As described above, posit bit strings (e.g., the data) can be stored and/or retrieved from the memory array 230. In some embodiments, the main memory I/O circuitry 214 can facilitate storing and/or retrieval of the posit bit strings to and/or from the memory array 230. For example, the main memory I/O circuitry 214 can be enabled to transfer posit bit strings to the memory array 230 to be stored, and/or the main memory I/O circuitry 214 can facilitate retrieval of the posit bit strings (e.g., posit bit strings representing a performed operation between one or more posit bit string operands) from the memory array 230 in response to, for example, a command from the controller 210 and/or the acceleration circuitry 220.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the acceleration circuitry 220, the RAS/CAS chain control circuitry 216 and/or the RAS/CAS chain component 218 can latch and/or resolve a specific location in the memory array 230 to which the bit strings that have been operated upon by the acceleration circuitry 220 is to be stored. Similarly, the RAS/CAS chain control circuitry 216 and/or the RAS/CAS chain component 218 can latch and/or resolve a specific location in the memory array 230 from which bit strings are to be transferred to the acceleration circuitry 220 prior to the acceleration circuitry 220 performing an operation on the bit strings.

In some embodiments, the RAS/CAS chain control circuitry 216 and the RAS/CAS chain component 218 can be used in conjunction with the memory array 230 to latch a row address and/or a column address to initiate an operation to retrieve one or more bit strings from the memory array 230. For example, responsive to the acceleration circuitry 220 (e.g., the state machine 123 illustrated in FIG. 1B and resident on the acceleration circuitry 220) requesting a bit string stored at a particular address of the memory array 230, the RAS/CAS chain control circuitry 216 and the RAS/CAS chain component 218 can latch a row address and/or a column address corresponding to the bit string(s) to facilitate retrieval of the requested bit string(s) from the memory array 230.

As described above in connection with FIGS. 1A and 1B and in more detail below in connection with FIG. 5, the acceleration circuitry 220 can be configured to receive a bit string having a first format (e.g., a bit string in a floating-point format), convert the bit string to a second format (e.g., convert the bit string to a universal number format such as a posit format), and/or cause performance of operations such as arithmetic and/or logical operations using the bit string(s) having the second format. In some embodiments, the acceleration circuitry 220 can cause the bit string(s) having the second format and/or the bit string(s) that include a result of the arithmetic and/or logical operation to be stored in a data structure (e.g. the data structure 634 illustrated in FIG. 6, herein) of the memory array 230.

The acceleration circuitry 220 can include logic circuitry (e.g., the logic circuitry 122 illustrated in FIGS. 1A and 1B) and memory resource(s) (e.g., the memory resource 124 illustrated in FIGS. 1A and 1B). Bit strings can be received by the acceleration circuitry 220 from, for example, the host 202 and/or the memory array 230, and stored by the acceleration circuitry 220, for example in the memory resource of the acceleration circuitry 220. The acceleration circuitry (e.g., the logic circuitry of the acceleration circuitry 220) can perform operations (or cause operations to be performed on) the bit strings to convert the bit strings from a floating-point format to a posit format, as described in more detail in connection with FIG. 5, herein.

As described in more detail in connection with FIGS. 3 and 4A-4B, posits can provide improved accuracy and may require less storage space (e.g., may contain a smaller number of bits) than corresponding bit strings represented in the floating-point format. Accordingly, by converting the floating-point bit strings to posit bit strings using the acceleration circuitry 220, performance of the memory device 202 may be improved in comparison to approaches that utilize only floating-point bit strings because operations may be performed more quickly on the posit bit strings (e.g., because the bit strings in the posit format are smaller and therefore requires less time and/or processing resources to perform operations on) and because less memory space is required in the memory device 202 to store the bit strings in the posit format, which can free up additional space in the memory device 202 for other bit strings, data and/or other operations to be performed. Further, by storing and subsequently retrieving bit strings in a data structure of a memory array 230, the bit strings can be subsequently accessed quickly for use in other operations and/or for use by applications running, for example, on the host 202 in a more efficient manner than in approaches that require performance of arithmetic and/or logical operations each time a result of such an operation is requested. Moreover, fewer clock cycles may be required to perform arithmetic and/or logical operations than in some approaches because results of arithmetic and/or logical operations between bit string operands may be retrieved from the memory array 230 in contrast to approaches in which the operations between the bit string operands are performed each time a result of such an operation is requested.

Once the acceleration circuitry 220 has performed the operation(s) to convert the bit strings from the floating-point format to the posit format, the acceleration circuitry can perform (or cause performance of) arithmetic and/or logical operations on the resultant posit bit strings. For example, as discussed above, the acceleration circuitry 220 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. As will be appreciated, the foregoing list of operations is not intended to be exhaustive, nor is the foregoing list of operations intended to be limiting, and the acceleration circuitry 220 may be configured to perform (or cause performance of) other arithmetic and/or logical operations. As described herein, the operands (e.g., bit string operands) used in such operations and/or the results of such operations may be stored in the memory array 230 and may be subsequently retrieved from the memory array 230 in response to a command from the acceleration circuitry 220.

In some embodiments, the acceleration circuitry 220 may perform the above-listed operations in conjunction with execution of one or more machine learning algorithms. For example, the acceleration circuitry 220 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. In many, a neural network may be trained over time to improve operation of particular tasks and/or particular goals.

However, in some approaches, machine learning (e.g., neural network training) may be processing intensive (e.g., may consume large amounts of computer processing resources) and/or may be time intensive (e.g., may require lengthy calculations that consume multiple cycles to be performed). In contrast, by performing such operations using the acceleration circuitry 220, for example, by performing such operations on bit strings that have been converted by the acceleration circuitry 220 into a posit format, the amount of processing resources and/or the amount of time consumed in performing the operations may be reduced in comparison to approaches in which such operations are performed using bit strings in a floating-point format. Further, by storing the results of operations on bit strings that have been converted into the posit format in the memory array 230 for subsequent retrieval, the amount of processing resources and/or the amount of time consumed in performing the operations may be even further reduced for subsequent requests for the results because the operation has already been performed.

As described above in connection with FIGS. 1A and 1B, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIG. 2. In some embodiments, the memory array 230 can be configured to store bit strings operated on by the acceleration circuitry 220 (e.g., resultant bit strings) and/or store bit strings to be transferred to the acceleration circuitry 220.

In some embodiments, the memory array 230 is configured to store a plurality of bit strings to be used as operands in performance of an arithmetic operation or a logical operation, or both. The controller 210, which is coupled to the memory array 230 can be configured to receive a request for the arithmetic operation or the logical operation, or both, to be performed using one or more bit strings. The request may be received from circuitry external to the memory device 204, such as the host 202. The controller 210 can be configured to determine a bit size of the one or more bit strings to be used in performance of the arithmetic operation or the logical operation and, responsive to a determination that performance of the arithmetic operation or the logical operation, or both, requires that the bit size of the one or more bit strings is less than a predetermined bit size, cause performance of the arithmetic operation or the logical operation, or both, using bit strings among the plurality of bit strings stored in the memory array 230.

The controller 210, which is coupled to the memory array 230 and the acceleration circuitry 220, can, in some embodiments, be configured responsive to a determination that performance of the arithmetic operation or the logical operation, or both, requires that the bit size of the one or more bit strings is greater than the predetermined bit size, send a command to the acceleration circuitry to cause the acceleration circuitry to perform the arithmetic operation or the logical operation, or both. In some embodiments, the predetermined bit size can be 16-bits or less, however, embodiments are not limited to a particular bit size.

As described in more detail, herein, the acceleration circuitry 220 can be configured to convert a bit string representing a result of the arithmetic operation or the logical operation, or both, to a format different than the format of the plurality of bit strings stored in the memory array 230. For example, the plurality of bit strings to be used as operands in performance of the arithmetic operation or the logical operation, or both, are stored in a data structure in the memory array 230. In a non-limiting example, the data structure (e.g., the data structure 634 illustrated in FIG. 6) can have a size between 16 megabytes and 1 gigabyte.

Figure 3:
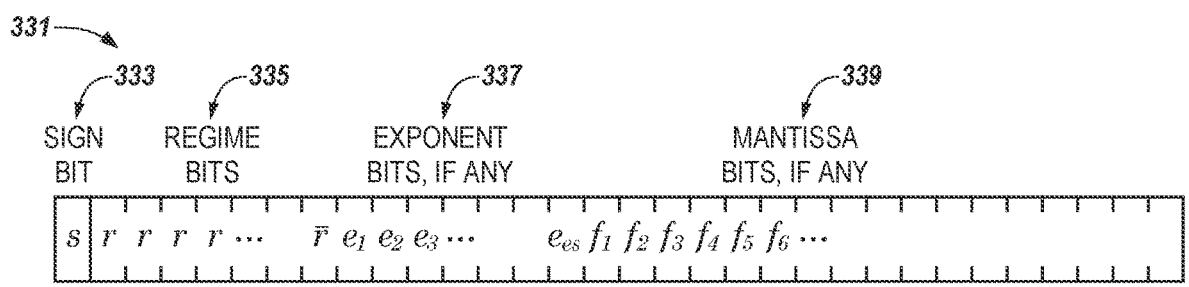
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a sign bit 333), a set of regime bits (e.g., the regime bits 335), a set of exponent bits (e.g., the exponent bits 337), and a set of mantissa bits (e.g., the mantissa bits 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed=2^{2^{es}}$. Several example values for used are shown below in Table 2.

TABLE 2

| es | 0 | 1 | 2 | 3 | 4 |
|---|---|---|---|---|---|
| useed | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction $f$, which can be analogous to the fraction $1.f$ where $f$ includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., $0.f$).

Figure 4A:
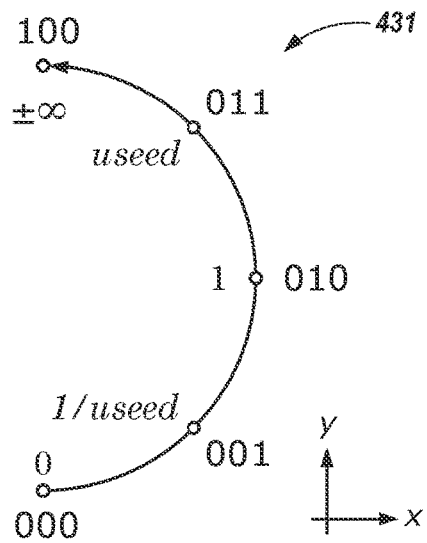
FIG. 4A is an example of positive values for a 3-bit posit.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to $$\frac{1}{useed}.$$

Between maxpos and ±∞, a new bit value may be maxpos*useed, and between zero and minpos, a new bit value may be $$\frac{minpos}{useed}.$$

These new bit values can correspond to a new regime bit 335. Between existing values x=$2^m$ and y=2n, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

Figure 4B:
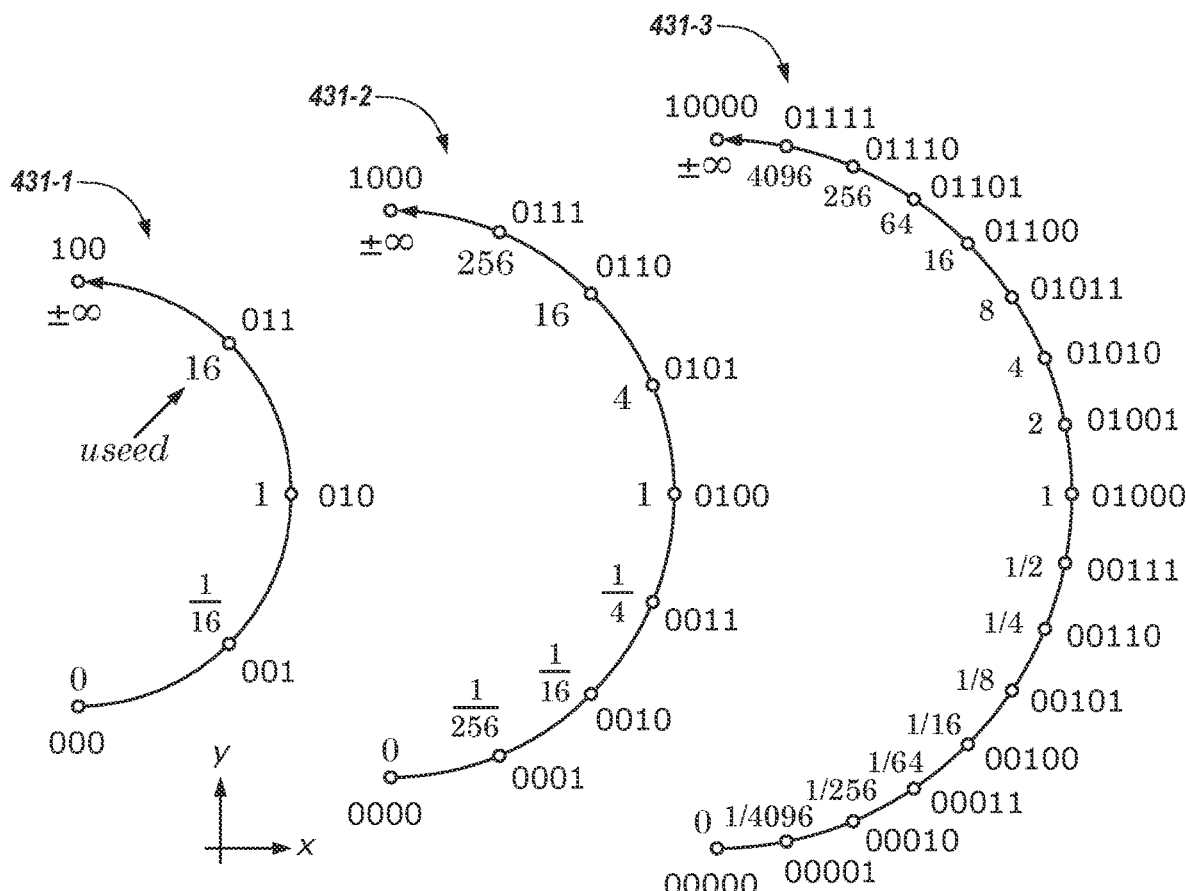
FIG. 4B is an example of posit construction using two exponent bits.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about they-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit ($\bar{r}$) appended thereto. As described above, between existing values, the corresponding bit strings have an additional exponent bit appended thereto. For example, the numerical values ¹⁄₁₆, ¼, 1, and 4 will have an exponent bit appended thereto. That is, the final one corresponding to the numerical value 4 is an exponent bit, the final zero corresponding o the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between ¹⁄₁₆ and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and $f$ is a value represented by 1. $f_1 f_2 \ldots f_{fs}$ (e.g., by a one followed by a decimal point followed by the mantissa bits 339), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases} \quad \text{Equation 1}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|---|---|---|---|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., useed$^k$). The exponent bits 337 represent five (5) as an unsigned integer and therefore contribute an additional scale factor of $2^e = 2^5 = 32$. Lastly, the mantissa bits 339, which are given in Table 3 as 11011101, represent two-hundred and twenty-one (221) as an unsigned integer, so the mantissa bits 339, given above as $f$ are $$f + \frac{221}{256}.$$

Using these values and Equation 1, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
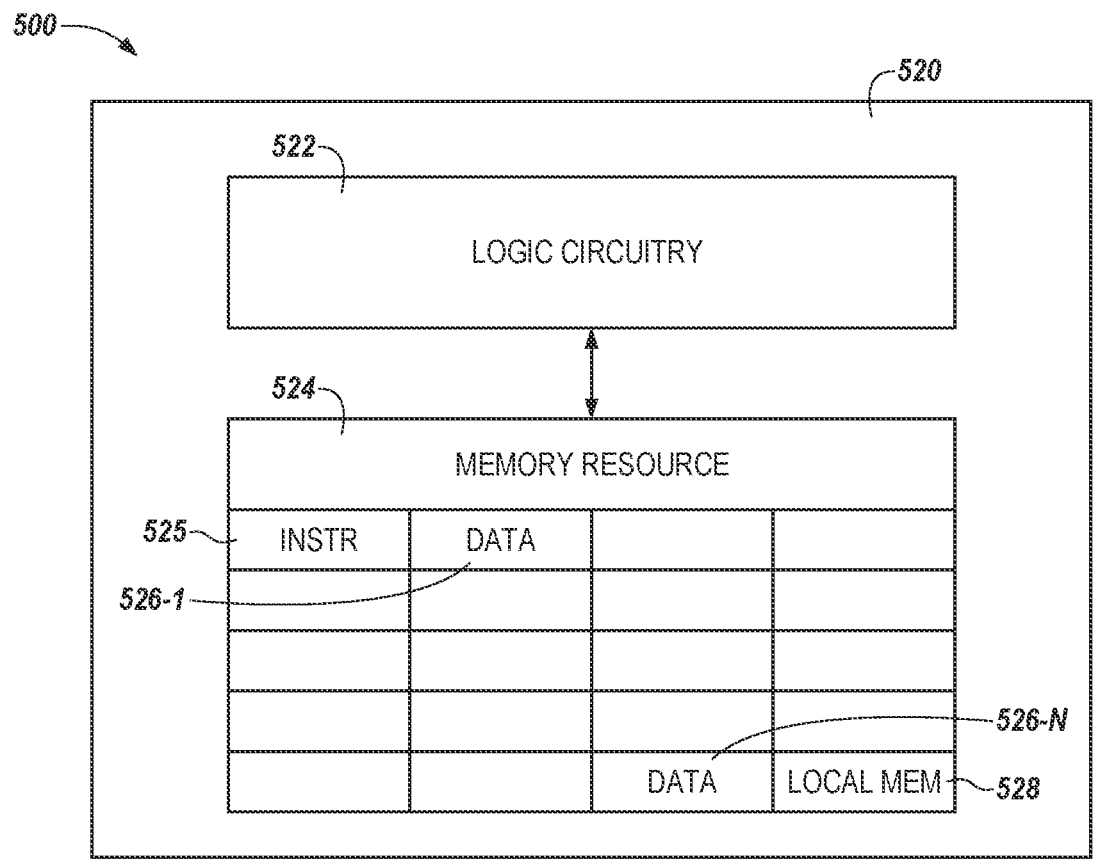
FIG. 5 is a functional block diagram in the form of acceleration circuitry in accordance with a number of embodiments of the present disclosure.

FIG. 5 is a functional block diagram in the form of an apparatus 500 including acceleration circuitry 520 in accordance with a number of embodiments of the present disclosure. The acceleration circuitry 520 can include logic circuitry 522 and a memory resource 524, which can be analogous to the logic circuitry 122 and the memory resource 124 illustrated in FIG. 1, herein. The logic circuitry 522 and/or the memory resource 524 can separately be considered an "apparatus."

The acceleration circuitry 520 can be configured to receive a command (e.g., an initiation command) from a host (e.g., the host 102/202 illustrated in FIGS. 1 and 2, herein) and/or a controller (e.g., the controller 210 illustrated in FIG. 2, herein) to initiate performance of one or more operations (e.g., bit string format conversion operations, arithmetic operations, logical operations, etc.) on data stored in the memory resource 524. Once the initiation command has been received by the acceleration circuitry 520, the acceleration circuitry can perform the operations described above in the absence of intervening commands from the host and/or the controller. For example, the acceleration circuitry 520 can include sufficient processing resources and/or instructions to perform operations on the bit strings stored in the memory resource 524 without receiving additional commands from circuitry external to the acceleration circuitry 520.

The logic circuitry 522 can be an arithmetic logic unit (ALU), a state machine, sequencer, controller, an instruction set architecture, or other type of control circuitry. As described above, an ALU can include circuitry to perform operations (e.g., operations to convert a bit string from a first format (e.g., a floating-point format) to a second format (e.g., a posit format) and/or arithmetic operations, logical operations, bitwise operations, etc.) such as the operations described above, on integer binary numbers, such as bit strings in the posit format. An instruction set architecture (ISA) can include a reduced instruction set computing (RISC) device. In embodiments in which the logic circuitry 522 includes a RISC device, the RISC device can include a processing resource that can employ a reduced instruction set architecture (ISA) such as a RISC-V ISA, however, embodiments are not limited to RISC-V ISAs and other processing devices and/or ISAs can be used. Further, as described above in connection with FIGS. 1B and 2, the logic circuitry 122 can comprise a state machine (e.g., the state machine 123 illustrated in FIG. 1B). The state machine can be configured to determine addresses corresponding to location in a memory array in which bit strings are stored and, responsive to a request for one or more bit strings stored in the memory array, retrieve one or more bit strings from the memory array based on the address at which the requested bit string(s) are stored.

In some embodiments, the logic circuitry 522 can be configured to execute instructions (e.g., instructions stored in the INSTR 525 portion of the memory resource 524) to perform the operations above. For example, the logic circuitry 524 is provisioned with sufficient processing resources to cause performance of such operations on the data (e.g., on bit strings) received by the acceleration circuitry 520. Further, the logic circuitry 522 can be configured to execute instructions (e.g., instructions stored in the INSTR 525 portion of the memory resource 524) to retrieve bit strings stored in a memory array, as described in more detail, herein.

Once the operation(s) are performed by the logic circuitry 522, the resultant bit strings can be stored in the memory resource 524 and/or a memory array (e.g., the memory array 230/630/730 illustrated in FIGS. 2, 6, and 7A-7C, herein). The stored resultant bit strings can be addressed such that it is accessible for performance of the operations. For example, the bit strings can be stored in the memory resource 524 and/or the memory array at particular physical addresses (which may have corresponding logical addresses corresponding thereto) such that the data or bit strings can be accessed in performing the operations. Embodiments are not so limited, however, and in some embodiments, the bit strings may be stored in a memory array such as the memory array 230/630/730 illustrated in FIGS. 2, 6, and 7A-7C, herein.

The memory resource 524 can, in some embodiments, be a memory resource such as random-access memory (e.g., RAM, SRAM, etc.). Embodiments are not so limited, however, and the memory resource 524 can include various registers, caches, buffers, and/or memory arrays (e.g., 1T1C, 2T2C, 3T, etc. DRAM arrays). The memory resource 524 can be configured to receive a bit string from, for example, a host such as the host 102/202 illustrated in FIGS. 1 and 2 and/or a memory array such as the memory array 130/230 illustrated in FIGS. 1 and 2, herein. In some embodiments, the memory resource 538 can have a size of approximately 256 kilobytes (KB), however, embodiments are not limited to this particular size, and the memory resource 524 can have a size greater than, or less than, 256 KB.

The memory resource 524 can be partitioned into one or more addressable memory regions. As shown in FIG. 5, the memory resource 524 can be partitioned into addressable memory regions so that various types of data can be stored therein. For example, one or more memory regions can store instructions ("INSTR") 525 used by the memory resource 524, one or more memory regions can store data 526-1, . . . , 526-N (e.g., data such as a bit string retrieved from the host and/or the memory array), and/or one or more memory regions can serve as a local memory ("LOCAL MEM.") 528 portion of the memory resource 538. Although 20 distinct memory regions are shown in FIG. 5, it will be appreciated that the memory resource 524 can be partitioned into any number of distinct memory regions.

As discussed above, bit string(s) can be retrieved from the host and/or memory array in response to messages and/or commands generated by the host, a controller (e.g., the controller 210 illustrated in FIG. 2, herein), or the logic circuitry 522. In some embodiments, the commands and/or messages can be processed by the logic circuitry 522. Once the bit string(s) are received by the acceleration circuitry 520 and stored in the memory resource 524, they can be processed by the logic circuitry 522. Processing the bit string(s) by the logic circuitry 522 can include converting the bit string(s) from a first format to a second format, performing arithmetic operations and/or logical operations on the converted bit string(s), and/or converting the bit string(s) that have been operated upon from the second format to the first format.

In some embodiments, a result of the arithmetic and/or logical operation performed on the converted data can be stored in a data structure (e.g., the data structure 634 illustrated in FIG. 6, herein) of a memory array (e.g., the 230/630/730 illustrated in FIGS. 2, 6, and 7A-7C, herein). As described above, the result of the arithmetic and/or logical operation performed on the converted data can be retrieved from the memory array in response to a command (e.g., a command from the logic circuitry 522) to request the result of the arithmetic and/or logical operation performed on the converted data. After retrieval of the result of the arithmetic and/or logical operation performed on the converted data, the acceleration circuitry 522 can convert the data that has been operated upon from the second format to the first format and, in some embodiments, transfer the re-converted result (e.g., the result of the operation that has been converted back to the first format) to circuitry external to the acceleration circuitry 520, such as a host or media device.

In a non-limiting neural network training application, the acceleration circuitry 520 can convert a floating-point bit string into an 8-bit posit with es=0. In contrast to some approaches that utilize a half-precision 16-bit floating-point bit string for neural network training, an 8-bit posit bit string with es=0 can provide comparable neural network training results two to four times faster than the half-precision 16-bit floating-point bit string.

A common function used in training neural networks is a sigmoid function $f(x)$ (e.g., a function that asymptotically approaches zero as $x \to -\infty$ and asymptotically approaches 1 as $x \to \infty$). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by the acceleration circuitry 520 by flipping the first bit of the posit representing x and shifting two bits to the right—operations that may take at least an order of magnitude fewer clock signals in comparison to evaluation of the same function using a half-precision 16-bit floating-point bit string.

In this example, by operating the acceleration circuitry 520 to convert a floating-point bit string into an 8-bit posit with es=0 and then subsequently operating the acceleration circuitry 520 to perform the operation to evaluate the example sigmoid function on the 8-bit posit bit string, processing time, resource consumption, and/or storage space can be reduced in comparison to approaches that do not include acceleration circuitry 520 configured to perform such conversion and/or subsequent operations. This reduction in processing time, resource consumption, and/or storage space can improve the function of a computing device in which the acceleration circuitry 520 is operating by reducing the number of clock signals used in performing such operations, which may reduce an amount of power consumed by the computing device and/or an amount of time to perform such operations, as well as by freeing up processing and/or memory resources for other tasks and functions. Further, by storing results of operations performed by, for example, the acceleration circuitry 520 in the memory array, subsequent calls that invoke evaluation of such operations may require even fewer clock cycles, further reducing an amount of time and/or power consumed by the computing device.

Figure 6:
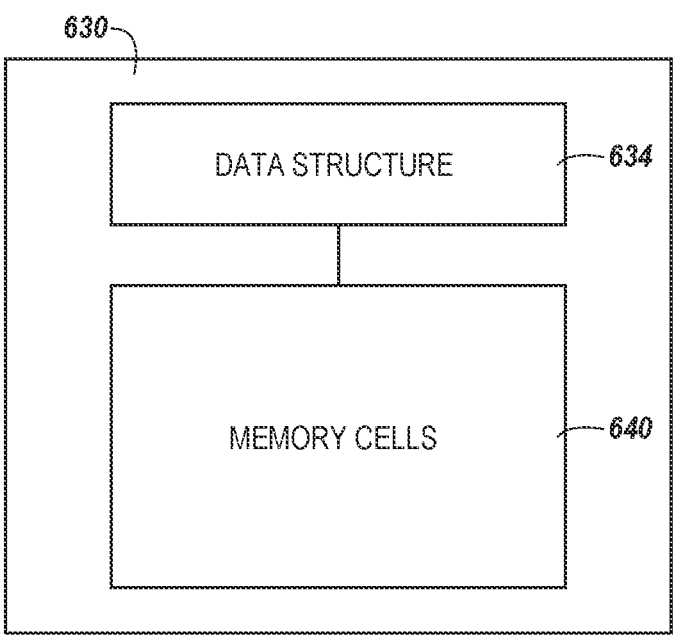
FIG. 6 is a functional block diagram illustrating a portion of a memory array in accordance with a number of embodiments of the present disclosure.

FIG. 6 is a functional block diagram illustrating a portion of a memory array 630 in accordance with a number of embodiments of the present disclosure. The memory array 630 can include a plurality of memory cells 640 and a data structure 634. In some embodiments, the data structure 634 can consist of a plurality of memory cells, however, distinction between the memory cells 640 and the data structure 634 is made in FIG. 6 to assist the reader in discerning between the portion of memory cells that are reserved for use as a data structure 634 and the portion of memory cells 640 that are free to perform functions generally performed by memory cells 640 in operation of a memory array 630.

The data structure 634 can allow for bit strings (e.g., posit bit strings) to be organized and stored. In some embodiments, the data structure 634 can be a table (e.g., a look-up table), a tree, record, or other suitable data structure that allows for posit bit strings to be organized and stored within the memory array 630.

In a non-limiting example, the data structure can be configured to store three 8-bit posit bit strings. The three 8-bit posit bit strings can correspond to a first posit bit string operand ("A"), a second posit bit string operand ("B"), and a result of an arithmetic operation or a logical operation performed between the posit bit string operand, A, and the posit bit string operand B. In this example, the acceleration circuitry (e.g., the acceleration circuitry 120/220 illustrated in FIGS. 1 and 2, herein) can perform a requested operation (e.g., an arithmetic operation and/or a logical operation) between the posit bit string operand A and the posit bit string operand B and cause the result of the operation (as well as the posit bit string operand A and the posit bit string operand B) in the data structure 634 of the memory array 630. In this example, if performance of the operation is required at a subsequent point in time, the controller (e.g., the controller 210 illustrated in FIG. 2) can request the result of the operation between the posit bit string A and the posit bit string B to be retrieved from the data structure 634 of the memory array 630.

The data structure 634 can have a predetermined size (e.g., on receipt of a power signal (e.g., a power up or initiation signal that initializes the memory array), the memory array 630 can allocate a fixed number of memory cells for use as a data structure) or the data structure 634 can be dynamically allocated by, for example, a controller such as the controller 210 illustrated in FIG. 2, herein. In some embodiments, the data structure 634 can have a size of around eight (8) megabytes (MB), although embodiments are not limited to this specific size. For example, in the example described above in which there are three 8-bit posit bit strings (e.g., a posit bit string operand A, a posit bit string operand B, and a resultant posit bit string representing a result of an operation performed between the posit bit string operand A and the posit bit string operand B) stored in the data structure 634, the size of the data structure 634 can be around 8 MB. In embodiments in which more than three 8-bit posit bit strings are stored in the data structure 634 of the memory array 630, and/or in cases in which the posit bit strings are smaller than 8-bits (e.g., 6-bit posit strings, 4-bit posit strings, etc.) or larger than 8-bits (e.g., 16-bits, 32-bits, 64-bits, etc.), however, the data structure can have a size that is less than 8 MB or a size that is greater than 8 MB.

In some embodiments, by performing the operation using the acceleration circuitry and then storing the result of the operation in the data structure 634 of the memory array 630, the result (and/or the posit bit string operands A and B) can be provided for use by a memory device (e.g., the memory device 204 illustrated in FIG. 2, herein) and/or a host (e.g., the host 202 illustrated in FIG. 2, herein) faster in comparison to approaches in which arithmetic and/or logical operations are performed in "real time" (e.g., in which the arithmetic and/or logical operations are performed each time performance of an arithmetic and/or logical operation is required.

Figure 7A:
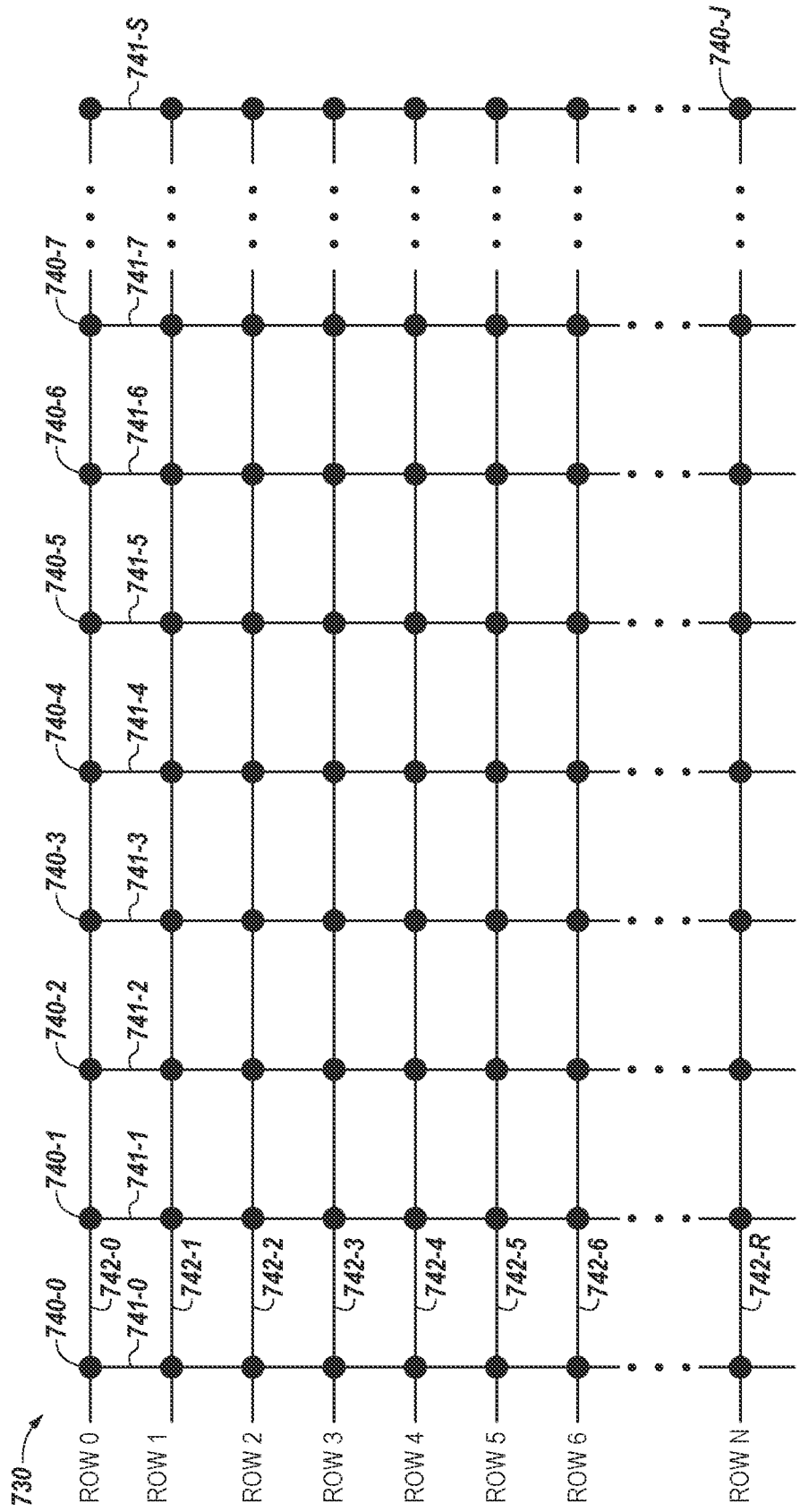
FIG. 7A illustrates a schematic diagram of a portion of a memory array in accordance with a number of embodiments of the present disclosure

FIG. 7A illustrates a schematic diagram of a portion of a memory array 730 in accordance with a number of embodiments of the present disclosure. The memory array 730 includes memory cells (referred to generally as memory cells 740, and more specifically as 740-0 to 740-J) coupled to rows of word lines (e.g., row lines) 742-0, 742-1, 742-2, 742-3, 742-4, 742-5, 742-6, ..., 742-R and columns of digit lines (e.g., bit lines) 741-0, 741-1, 741-2, 741-3, 741-4, 741-5, 741-6, 741-7, ..., 741-S. The memory array 730 is not limited to a particular number of access lines and/or sense lines, and use of the terms "rows" and "columns" does not intend a particular physical structure and/or orientation of the word lines and/or digit lines. Although not pictured, each column of memory cells can be associated with a corresponding pair of complementary sense lines.

The memory cells 740 can be any type of memory cell. Non-limiting examples of memory cells 740 can include two transistor-one capacitor (2T1C) memory cells 740, one transistor-one capacitor (1T1C) memory cells 740 (e.g., memory cells consisting of a single MOSFET access transistor and a single storage capacitor), three-transistor (3T) memory cells 740, such as those shown in more detail in FIGS. 7B and 7C, herein, etc.

In some embodiments, a portion of the memory array 730 can be reserved for use as a data structure (e.g., the data structure 634 illustrated in FIG. 6, herein). The data structure (e.g., a look-up table) can store one or more bit strings in the posit format. The one or more bit strings stored in the posit format in the data structure can be used in performance of various memory operations, such as arithmetic operations and/or logical operations, as described in more detail, herein. For example, one or more rows and/or columns of memory cells 740 can be reserved as a data structure to store one or more bit strings in the posit format. As described above in connection with FIG. 6, the data structure can be a table, tree, record, tensor, or other data structure that can facilitate storage of the one or more bit strings stored in the posit format.

Figure 7B:
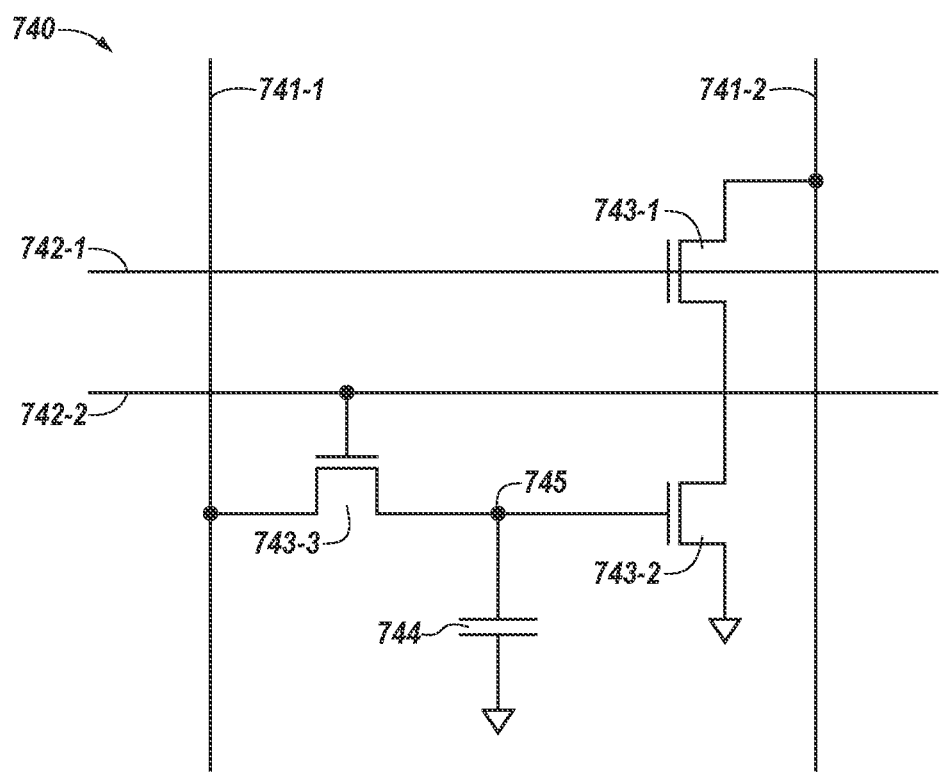
FIG. 7B is a schematic drawing illustrating a portion of a three transistor memory array in accordance with a number of embodiments of the present disclosure.

FIG. 7B is a schematic drawing illustrating a portion of a three transistor memory array 730 in accordance with a number of embodiments of the present disclosure. FIG. 7B illustrates one memory cell 740, which can be one of a number of memory cells corresponding to memory array 130 shown in FIGS. 1A and 1B. In the example shown in FIG. 7B, the memory cell 740 is a 3T DRAM memory cell. In this example, the memory cell 740 comprises three transistors 743-1, 743-2, and 743-3. The memory cell 740 may be operated to store a data value (e.g., stored charge at node 745). The data value stored at the node 745 may be a bit corresponding to a bit string (e.g., a bit string stored in the posit format). In some embodiments, a charge associated with the data value may be stored at node 745 using the parasitic capacitance generated between transistor 743-3 and transistor 743-2. Embodiments are not so limited; however, and the memory cell 740 may optionally include a discrete capacitor 744 to store the data value.

The memory cell 740 includes two word lines 742-1/742-2 (e.g., row lines) and two digit lines 741-1/741-2 (e.g., bit lines). Word line 742-1 may be referred to herein as a read row line, and the word line 742-2 may be referred to herein as a write row line. Digit line 741-1 may be referred to herein as a write digit line, and digit line 741-2 may be referred to herein as a read digit line. The word lines 742-1/742-2 and the digit lines 741-1/741-2 may be enabled and/or disabled in conjunction with reading and writing data to the node 745 of the memory cell 740.

As shown in FIG. 7B, the transistors 744-2, 744-2, and 744-3 are coupled to the word lines 742-1/742-2 and digit lines 741-1/741-2. In association with performing a write operation, the write row line 742-2 may be enabled, and data may be placed on the write digit line 741-1, thereby causing the data to be stored at node 745. Similarly, in association with performing a read operation, the read row line 742-1 may be enabled and the data may be transferred out of the node 745 via the read digit line 741-2. In some embodiments, the data value read out of the memory cell 740 as part of a read operation may be inverted in comparison to the data value written to the memory cell 740 as part of the write operation. For example, if a value of "1" is written to the memory cell 740, a value of "0" may be read out of the memory cell 740. Conversely, if a value of "0" is written to the memory cell 740, a value of "1" may be read out of the memory cell 740.

For example, memory cell 740 can be coupled to different digit lines 741-1/741-2 and word lines 742-1/742-2. For instance, in this example, a first source/drain region of transistor 743-3 is coupled to digit line 741-1, a second source/drain region of transistor 743-3 is coupled to node 745, and a gate of transistor 743-3 is coupled to word line 742-2. A first source/drain region of transistor 743-1 is coupled to digit line 741-2, a second source/drain region of transistor 743-1 is coupled to a first source/drain region of transistor 743-2, and a gate of transistor 743-1 is coupled to word line 742-1.

In some embodiments, the data value stored at node 745 of the memory cell 740 may be used as an operand for performance of a logical operation. For example, a data value stored at node 745 of the memory cell 740 may be used as an operand to perform a logical operation with a data value stored at node 745 of a different memory cell. In some embodiments, the logical operation may comprise a NOR operation; however, embodiments are not so limited, and various logical operations such as ANDS, ORs, XORs, NANDs etc. operations may be performed by performing multiple combinations of NOR operations in the manner described herein.

In some embodiments, the memory cell 740 may be controlled to store a data value at node 745 subsequent to performance of a read operation. For example, the memory cell 740 may be controlled such that read operations are non-destructive. This may allow for multiple rows (e.g., read rows) to be fired without refreshing or re-writing data to the memory cell 740, which may allow for improved performance and reduced power consumption in comparison with previous approaches that utilize destructive read cells such as 1T1C memory cells.

Although schematically represented in a planar orientation, the transistors 743-1, 743-2, and/or 743-3 may be arranged in a vertical orientation (e.g., extending upward out of the page or downward into the page in FIG. 7A). In some embodiments, the transistors 743-1, 743-2, and/or 743-3 of the memory cell 740 may be formed such that the transistors 743-1, 743-2, and/or 743-3 are contained within an area defined by the digit lines 741-1/741-2. For example, the transistors 743-1, 743-2, and/or 743-3 of the memory cell 740 may be formed on pitch with digit lines 741-1/741-2 of the memory cell 740. In some embodiments, the memory cell 740 may be formed such that the transistors 743-1, 743-2, and/or 743-3 of the memory cell 740 are disposed within an area that equal to or less than an area used by a conventional 1T1C DRAM memory cell.

Figure 7C:
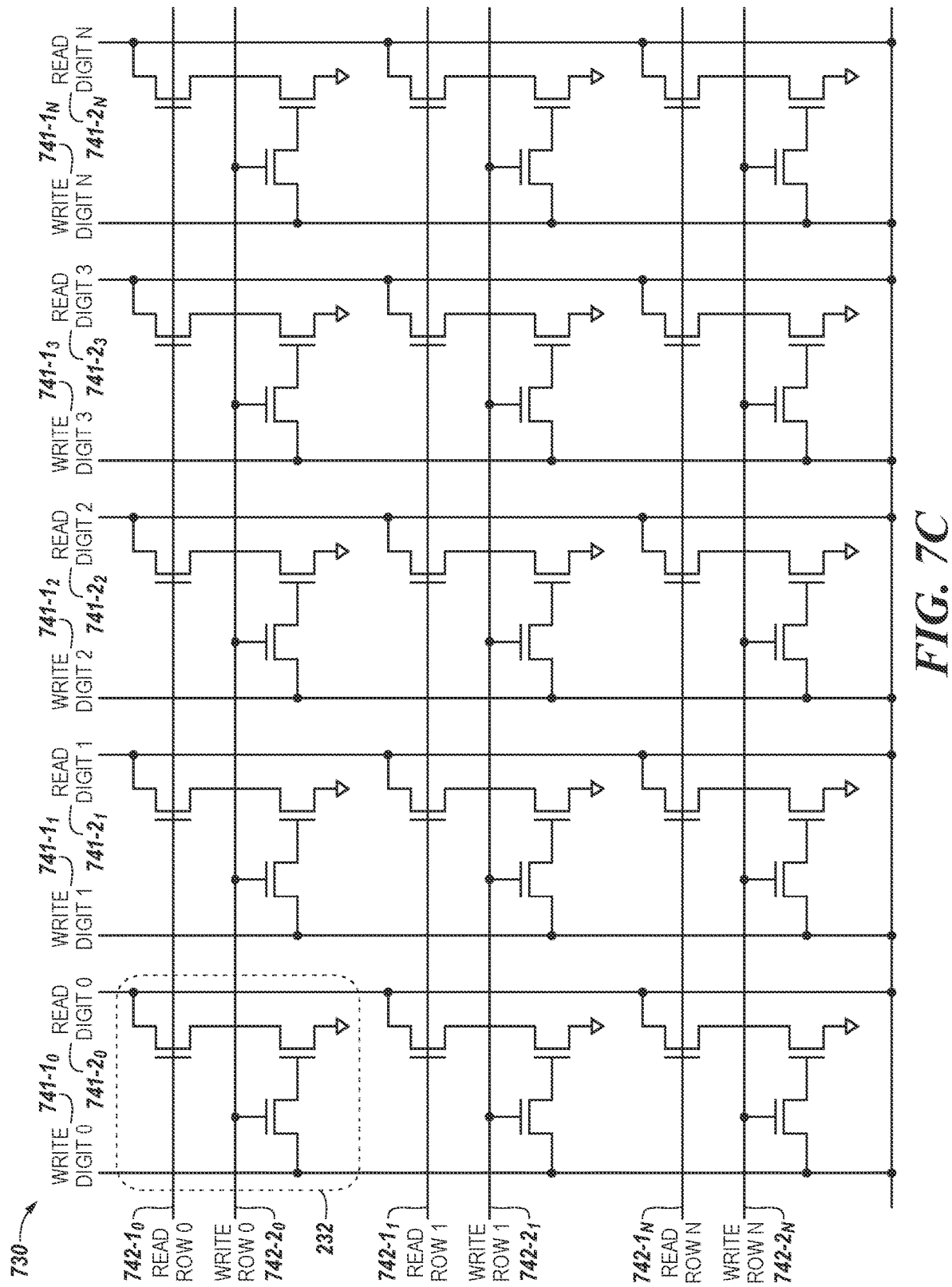
FIG. 7C is another schematic drawing illustrating a portion of a three transistor memory array in accordance with a number of embodiments of the present disclosure.

FIG. 7C is another schematic drawing illustrating a portion of a three transistor memory array 740 in accordance with a number of embodiments of the present disclosure. As shown in FIG. 7C, the memory array 730 comprises a plurality of memory cells 740. For clarity, only one memory cell 740 is labeled in FIG. 7C; however, each set of three transistors illustrated in FIG. 7C represents one of a plurality of memory cells 740 associated with the memory array 730.

A plurality of memory cells 740 are coupled to a plurality of digit lines 741 and row lines 742. For example, a first memory cell 740 is coupled to digit lines $741\text{-}1_0/741\text{-}2_0$ (e.g., write digit0 line $741\text{-}1_0$ and read digit0 line $741\text{-}2_0$) and row lines $742\text{-}1_0/742\text{-}2_0$ (e.g., read row0 line $742\text{-}1_0$ and write row0 line $742\text{-}2_0$). Similarly, a second memory cell is coupled to digit lines $741\text{-}1_1/741\text{-}2_1$ (e.g., write digit1 line $741\text{-}1_1$ and read digit1 line $741\text{-}2_1$) and word lines $742\text{-}1_0/742\text{-}2_0$ (e.g., read row0 line $742\text{-}1_0$ and write row0 line $742\text{-}2_0$), a third memory cell is coupled to digit lines $741\text{-}1_0/741\text{-}2_0$ (e.g., write digit0 line $741\text{-}1_0$ and read digit0 line $741\text{-}2_0$) and word lines $742\text{-}1_1/742\text{-}2_1$ (e.g., read row1 line $742\text{-}1_1$ and write row1 line $742\text{-}2_1$), etc.

In operation, the memory array 730 may be controlled to perform an arithmetic and/or logical operation using data values (e.g., bit strings stored in the posit format) stored in the memory cells. In some embodiments, performance of such arithmetic and/or logical operations can include precharging at least one of the digit lines $741\text{-}2_0, \ldots, 741\text{-}2_N$. Once the at least one digit line is precharged (e.g., to a supply voltage such as $V_{cc}$), one or more word lines $742\text{-}1_0, \ldots, 742\text{-}1_N$ and/or $742\text{-}2_0, \ldots, 742\text{-}2_N$ may be enabled. Each word line $742\text{-}1_0, \ldots, 742\text{-}1_N$ and/or $742\text{-}2_0, \ldots, 742\text{-}2_N$ that is enabled may correspond to an input of a K-input NOR operation where K is the quantity of word lines enabled. For example, if only two word lines (e.g., word line $742\text{-}1_0$ and word line $742\text{-}1_1$) are enabled, a 2-input NOR gate results, if three word lines (e.g., word line $742\text{-}1_0$, word line $742\text{-}1_1$, and word line 742-12) are enabled, a 3-input NOR operation results, etc. Further, each digit line $741\text{-}2_0, \ldots, 741\text{-}2_N$ that is enabled may correspond to an additional K-input NOR gate. Accordingly, each digit line $741\text{-}2_0, \ldots, 741\text{-}2_N$ that is enabled may correspond to N NOR gates that each comprise K-inputs where N is the number of enabled digit line $741\text{-}2_0, \ldots, 741\text{-}2_N$. As an example, if three word lines (e.g., word lines $742\text{-}1_0, \ldots, 742\text{-}1_3$ and/or word lines $742\text{-}2_0, \ldots, 742\text{-}2_3$) are enabled and each word line enables 1024 digit lines (e.g., when K=3 and N=1024), then 1024 3-input NOR gates result. That is, in some embodiments, enabling combinations of K word lines and N digit lines yields N NOR gates each having K inputs associated therewith.

In some embodiments, if one or more memory cells 740 coupled to a particular digit line $741\text{-}2_0, \ldots, 741\text{-}2_N$ (e.g., if one or more memory cells in a particular column of memory cells) contains a high voltage (e.g., a logical value of "1"), the associated digit line $741\text{-}2_0, \ldots, 741\text{-}2_N$ will be driven to a ground reference potential. For example, if memory cell 740 (or any other memory cell in the column of memory cells coupled to digit line $741\text{-}2_0$) contains a high voltage, digit line $741\text{-}2_0$ will be driven to a ground reference potential.

In some embodiments, a sense amplifier is coupled to respective pairs of digit lines $741\text{-}1_0, \ldots, 741\text{-}1_N$ and $741\text{-}2_0, \ldots, 741\text{-}2_N$. The sense amplifier may sense a low voltage (e.g., a logical value of "0") if one or more of the memory cells coupled to a same pair of digit lines $741\text{-}1_0, \ldots, 741\text{-}1_N$ and $741\text{-}2_0, \ldots, 741\text{-}2_N$ that are also coupled to the sense amplifier contains a high voltage (e.g., a logical value of "1"). Conversely, the sense amplifier may sense a high voltage (e.g., a logical value of "1") if one or more of the memory cells coupled to a same pair of digit lines $741\text{-}1_0, \ldots, 741\text{-}1_N$ and $741\text{-}2_0, \ldots, 741\text{-}2_N$ that are also coupled to the sense amplifier contains a low voltage (e.g., a logical value of "0"). That is, in some embodiments, the sense amplifier may sense a particular value (e.g., a "1" or a "0") based on the value stored in the memory cell that is coupled thereto.

As mentioned above, because a read operation using the memory cell 740 described in FIGS. 7B and 7C may be non-destructive, the memory cell 740 may still contain the original data value (e.g., the same high or low voltage) that was stored therein prior to performance of the read operation and/or performance of the logical operation, while the sense amplifier may contain a result of the logical operation after performance of the logical operation. In some embodiments, the data value (e.g., the logical value of "0" or "1") stored in the sense amplifier subsequent to performance of the logical operation may be written back to any memory cell 740 (or row of memory cells) in the memory array 730.

FIG. 8 is a flow diagram representing an example method 850 for a memory array data structure for posit operations in accordance with a number of embodiments of the present disclosure. At block 852, the method 850 can include performing an arithmetic operation or a logical operation, or both, using a first universal number bit string stored in a memory array and a second universal number (unum) bit string stored in the memory array. For example, the method 850 can include performing an arithmetic operation and/or a logical operation using a first posit bit string stored in a memory array and a second posit bit string stored in the memory array. The memory array can be analogous to the memory array 130/230/630/730 illustrated in FIGS. 1, 2, 6, and 7A-7B, respectively. The arithmetic operation can, as described above, include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, as well as trigonometric operations such as sine, cosine, tangent, etc., while the logical operation can include logical operations such as AND, OR, XOR, NOT, etc.

The method 850 can further include performing, using acceleration circuitry coupled to the memory array, a first conversion operation to generate the first unum bit string from a first floating-point bit string and performing, using acceleration circuitry coupled to the memory array, a second conversion operation to generate the second unum bit string from a second floating-point bit string. The acceleration circuitry can be analogous to the acceleration circuitry 120/220 illustrated in FIGS. 1 and 2, respectively. In some embodiments, the method 850 can include causing the first unum bit string and the second unum bit string to be stored in the memory array prior to performance of the arithmetic operation and/or the logical operation using the first unum bit string and the second unum bit string.

For example, as discussed above, the acceleration circuitry can include circuitry configured to receive a bit string stored in a first format (e.g., in a floating-point format) and perform one or more operations to convert the bit string to a bit string stored in a second format (e.g., in a unum format such as a posit format). The acceleration circuitry can be further configured to cause the bit string(s) that have been converted to the unum format to be stored in the memory array. In some embodiments, the bit string(s) that are stored in the unum format can be stored in a data structure (e.g., the data structure 634 illustrated in FIG. 6, herein) in the memory array.

The method 850 can further include transferring, via a plurality of shared input/output (I/O) lines coupled to the memory array, the first unum bit string and the second unum bit string from acceleration circuitry coupled to the memory array. In some embodiments, the shared I/O lines can be configured to transfer the first unum bit string and/or the second unum bit string to the memory array in chunks. For example, the shared I/O lines can be configured to transfer data (e.g., the posit bit string(s) in 512-bit, 1024-bit, 2048-bit, etc. chunks. In a non-limiting embodiment, there can be four shared I/O lines and each I/O line can be configured to transfer a chunk of data in parallel with the other shared I/O lines. Accordingly, in a non-limiting embodiment in which there are four shared I/O lines and each of the shared I/O lines is configured to transfer 512-bits of data in parallel, a 2048-bit bit string can be transferred to the memory array in a single operation. Similarly, in a non-limiting example in which there are four shared I/O and each of the shared I/O lines is configured to transfer 2048 bits of data in parallel, a 8192-bit bit string can be transferred to the memory array in a single operation.

In some embodiments, the method 850 can include performing the arithmetic operation and/or the logical operation without transferring the unum posit bit string or the second unum bit string to circuitry external to the memory array. For example, the arithmetic and/or logical operation can be performed within the memory array without enabling (e.g., firing) the shared I/O lines to transfer the first unum bit string or the second unum bit string to circuitry external to the memory array. Stated alternatively, the memory array can be configured to manipulate the first unum bit string and/or the second unum bit string to perform the arithmetic and/or logical operation without encumbering or utilizing circuitry external to the memory array. For example, the memory array can be configured to store the first unum bit string and/or the second unum bit string in separate rows of the memory array and manipulate the rows in which the first unum bit string and the second unum bit string are stored to perform the arithmetic and/or logical operations.

The method 850 can further include determining that the arithmetic operation and/or the logical operation requires a third unum bit string that has a bit length greater than a bit length of the first unum bit string and the second unum bit string. For example, in embodiments where the first unum bit string and/or the second unum bit string are 8-bit posit bit strings, the method 850 can include determining that a unum bit string required for performance of the arithmetic operation and/or the logical operation has a bit length greater than 8-bits (e.g., 16-bits, 24-bits, 32-bits, etc.). Similarly, in embodiments where the first unum bit string and/or the second unum bit string are 16-bit posit bit strings, the method 850 can include determining that a unum bit string required for performance of the arithmetic operation and/or the logical operation has a bit length greater than 16-bits (e.g., 24-bits, 32-bits, 64-bits, etc.).

In response to the determination that a unum bit string (e.g., the third unum bit string) having a bit length greater than the length of the unum bit strings stored in the memory array (e.g., the first unum bit string and/or the second unum bit string), the method 850 can include generating, using acceleration circuitry coupled to the memory array, the third unum bit string. For example, the acceleration circuitry can receive a floating-point bit string and convert the floating-point bit string to a unum bit string as described in connection with FIGS. 1-5, herein. Subsequent to converting the bit string having the bit length greater than the length of the unum bit strings stored in the memory array, the acceleration circuitry can cause the arithmetic operation and/or the logical operation to be performed using the third unum bit string.

In some embodiments, performing the arithmetic operation and/or the logical operation using the third unum bit string can include storing the third unum bit string in the memory array and performing the operation within the memory array (e.g., performing the operation in the memory array without transferring the third unum bit string to circuitry external to the memory array during performance of the arithmetic and/or logical operation), and/or the performing the arithmetic operation and/or the logical operation using the third unum bit string can include using the acceleration circuitry to perform the arithmetic operation and/or the logical operation.

The method 850 can include performing the arithmetic operation and/or the logical operation using a first unum string stored in a three transistor (3T) memory array (e.g., the 3T memory array illustrated in FIG. 7B, herein) and a second posit string stored the 3T memory array and/or performing the arithmetic operation and/or the logical operation on a first unum string stored in a dynamic random-access (DRAM) memory array (e.g., the DRAM array illustrated in FIG. 7A, herein) and a second unum string stored the DRAM memory array.

FIG. 9 is another flow diagram representing an example method 960 for arithmetic logic circuitry in accordance with a number of embodiments of the present disclosure. At block 962, the method 960 can include determining, using circuitry coupled to a memory array (e.g., the memory array 130, 230, 630, 70 illustrated in FIGS. 1A, 1B, 2, 6, and 7A-7C, herein), an address location in the memory array in which a posit bit string corresponding to a result of at least one of an arithmetic operation and a logical operation is stored. In some embodiments, the circuitry coupled to the memory can include acceleration circuitry (e.g., the acceleration circuitry 120/220 illustrated in FIGS. 1A, 1B, and 2, herein), which, as described above can include a processing device such as a state machine (e.g., the state machine 123 illustrated in FIG. 1B, herein).

At block 964, the method 960 can include generating, using the circuitry, a command to retrieve the posit bit string corresponding to the result of the arithmetic operation and/or the logical operation. In some embodiments, the command generated using the circuitry can include a command to retrieve the posit bit string corresponding to the result of the arithmetic operation and/or the logical operation from the array and/or can include a command to cause one or more posit bit string operands to be stored in the memory array.

At block 966, the method 960 can include causing the result of arithmetic operation and/or the logical operation to be transferred to circuitry external to the memory array. In some embodiments, causing the result of the arithmetic operation and/or the logical operation to be transferred to circuitry external to the memory array without receiving a command from a host coupleable to the circuitry and the memory array. For example, the circuitry can be configured to cause the result of the arithmetic operation and/or the logical operation to be transferred to circuitry external to the memory array without receipt of a command transferred over one of the channels 103/203 and/or 205 illustrated in FIGS. 1A, 1B, and 2, herein. That is, in some embodiments, the circuitry can be configured to perform various operations without encumbering a host (e.g., the host 102/202 illustrated in FIGS. 1A, 1B, and 2, herein).

In some embodiments, the method 960 can further include determining, using the circuitry coupled to the memory array, an address location in the memory array in which at least one posit bit string operand is stored, generating, using the circuitry, a command to retrieve the at least one posit bit string operand, and/or causing the at least one posit bit string operand to be transferred to circuitry external to the memory array. The posit bit string operands can be used, for example, by the acceleration circuitry to generate resultant posit bit strings for arithmetic operations and/or logical operations that may not be stored in the memory array. Further, in some embodiments, the posit bit string operands may be retrieved and used in the performance of operations using the acceleration circuitry when it is determined that a length of a posit bit string operand and/or a resultant posit bit string operand that corresponds to performance of an arithmetic operation and/or a logical operation is longer than a predetermined length.

As a non-limiting example, if the memory array is configured to store 8-bit posit bit string operand and/or resultant 8-bit posit bit strings and an operation that requires 16-bit posit bit strings and/or an operation that will yield a 16-bit resultant posit bit string is to be performed, the method 960 can include retrieving the 16-bit posit bit string operands and performing the operation using the acceleration circuitry. The result of such an operation can be stored in the memory array or the result can be transferred to circuitry external to the memory array, such as the host.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    determining an address location in a data structure within a memory array in which a posit bit string is stored in response to receipt of an initiation command received from a host;
    executing a command to retrieve the posit bit string stored at the address location in the memory array without receiving a command from the host in addition to the initiation command; and
    causing the posit bit string to be transferred to circuitry external to the memory array without receiving a command from the host in addition to the initiation command.

2. The method of claim 1, further comprising retrieving, in response to the command to retrieve the posit bit string corresponding to a result of an arithmetic operation or a logical operation, or both, from the data structure stored in the memory array.

3. The method of claim 2, wherein the data structure has a size between 16 megabytes and 1 gigabyte.

4. The method of claim 1, wherein circuitry coupled to the memory array comprises a state machine configured to perform operations that include:
    generating commands to retrieve the posit bit string from the memory array; and
    generating commands to cause one or more posit bit string to be stored in the memory array.

5. The method of claim 1, further comprising performing an arithmetic operation or a logical operation, or both, to generate the posit bit string corresponding to a result of the arithmetic operation or the logical operation, or both, using a processing device coupled to the memory array.

6. The method of claim 5, further comprising causing the result of the arithmetic operation or the logical operation, or both, to be transferred to the circuitry external to the memory array without receiving the command from the host couplable to the circuitry and the memory array.

7. The method of claim 1, further comprising:
    determining, using circuitry coupled to the memory array, an address location in the memory array in which at least one posit bit string operand is stored;
    generating, using the circuitry coupled to the memory array, a command to retrieve the at least one posit bit string operand; and
    causing the at least one posit bit string operand to be transferred to the circuitry external to the memory array.

8. An apparatus, comprising:
    a memory array; and
    a state machine coupled to the memory array, wherein the memory array and the state machine are included in a memory device, and wherein the state machine is configured to:
        determine an address location in a data structure within the memory array in which a posit bit string is stored in response to receipt of an initiation command received from a host coupled to the memory device;
        execute a command to retrieve the posit bit string stored at the address location in the memory array without receiving a command in addition to the initiation command; and
        cause the posit bit string to be transferred to circuitry external to the memory array without receiving a command in addition to the initiation command.

9. The apparatus of claim 8, wherein the posit bit string corresponds to a result of an arithmetic operation or a logical operation, or both, performed using one or more posit bit string operands.

10. The apparatus of claim 9, wherein the one or more posit bit string operands are stored in the data structure in the memory array.

11. The apparatus of claim 8, wherein the state machine is configured to:
execute a specified set of instructions to write, read, copy, or erase data stored in the memory array.

12. The apparatus of claim 8, wherein the posit bit string comprises an 8-bit posit bit string.

13. The apparatus of claim 8, wherein the data structure has a size of eight megabytes (MB).

14. A system, comprising:
a host; and
a memory device coupled to the host, the memory device comprising a memory array and
a state machine coupled to the memory array, wherein the state machine is configured to:
determine an address location in a data structure within the memory array in which a posit bit string is stored in response to receipt of an initiation command received from the host;
execute a command to retrieve the posit bit string stored at the address location in the memory array without receiving a command from the host in addition to the initiation command; and
cause the posit bit string to be transferred to circuitry external to the memory array without receiving a command from the host in addition to the initiation command.

15. The system of claim 14, wherein the posit bit string corresponds to a result of an arithmetic operation or a logical operation, or both, performed using one or more posit bit string operands.

16. The system of claim 15, wherein the one or more posit bit string operands are stored in the data structure in the memory array.

17. The system of claim 14, wherein the posit bit string comprises an 8-bit posit bit string or a 16-bit posit bit string.

18. The system of claim 14, wherein the data structure has a size between 8 megabytes and 1 gigabyte.

19. The system of claim 14, wherein:
the state machine is further configured to cause the posit bit string to be transferred to circuitry external to the memory array by sending a signal to enable main memory input/output (I/O) circuitry, and
the posit bit string is transferred to the circuitry external to the array via the main memory I/O circuitry.

20. An apparatus, comprising:
a memory array; and
a state machine coupled to the memory array, wherein the state machine is configured to:
determine an address location in a data structure within the memory array in which a posit bit string is stored;
execute a command to retrieve the posit bit string stored at the address location in the memory array; and
cause the posit bit string to be transferred to circuitry external to the memory array by sending a signal to enable main memory input/output (I/O) circuitry, and
wherein the posit bit string is transferred to the circuitry external to the array via the main memory I/O circuitry.

\* \* \* \* \*